United States Patent
Hanamaki et al.

(10) Patent No.: US 7,394,114 B2
(45) Date of Patent: Jul. 1, 2008

(54) SEMICONDUCTOR DEVICE AND MANUFACTURING METHOD THEREFOR

(75) Inventors: Yoshihiko Hanamaki, Tokyo (JP); Kenichi Ono, Tokyo (JP); Masayoshi Takemi, Tokyo (JP); Makoto Takada, Osaka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/549,983

(22) Filed: Oct. 17, 2006

(65) Prior Publication Data

US 2007/0272935 A1  Nov. 29, 2007

(30) Foreign Application Priority Data

May 29, 2006 (JP) ............... 2006-148779

(51) Int. Cl.
*H01L 33/00* (2006.01)
(52) U.S. Cl. ............ 257/200; 257/183; 257/201; 257/615; 257/E33.049
(58) Field of Classification Search ........ 257/183, 257/200, 201, 615, E33.049
See application file for complete search history.

(56) References Cited

U.S. PATENT DOCUMENTS

| | | | | |
|---|---|---|---|---|
| 5,153,889 A * | 10/1992 | Sugawara et al. | ........ | 372/45.01 |
| 5,684,309 A * | 11/1997 | McIntosh et al. | .......... | 257/191 |
| 5,859,864 A * | 1/1999 | Jewell | ............ | 372/45.012 |
| 6,849,881 B1 * | 2/2005 | Harle et al. | ............ | 257/191 |
| 7,049,212 B2 * | 5/2006 | Nakamura et al. | .......... | 438/608 |
| 7,208,774 B2 * | 4/2007 | Hashimoto et al. | .......... | 257/102 |
| 7,235,816 B2 * | 6/2007 | Takahashi et al. | ........... | 257/94 |
| 2002/0171091 A1 * | 11/2002 | Goetz et al. | ............ | 257/103 |
| 2005/0127397 A1 * | 6/2005 | Borges et al. | ............ | 257/189 |
| 2005/0285127 A1 * | 12/2005 | Noto et al. | ............ | 257/96 |
| 2006/0091421 A1 * | 5/2006 | Ono et al. | ............ | 257/200 |
| 2006/0118914 A1 * | 6/2006 | Yoo | ............ | 257/615 |

FOREIGN PATENT DOCUMENTS

JP        2000-91707        3/2000

OTHER PUBLICATIONS

T. Nittono et al.; "Photoluminescence characterization of InGaP/GaAs heterostructures grown by metalorganic chemical vapor deposition", *J. of Applied Physics*, vol. 78, No. 9 (Nov. 1, 1995) pp. 5387-5390.

D. P. Bour, et al.; "$Ga_{0.5}In_{0.5}P$/GaAs interfaces by organometallic vapor-phase epitaxy", *J. of Applied Physics*, vol. 63, No. 4, (Feb. 15, 1988), pp. 1241-1243.

\* cited by examiner

*Primary Examiner*—Evan Pert
*Assistant Examiner*—Victor A. Mandala, Jr.
(74) *Attorney, Agent, or Firm*—Leydig, Voit & Mayer, Ltd.

(57) ABSTRACT

A laser diode includes a first n-cladding layer disposed on and lattice-matched to an n-semiconductor substrate, wherein the first n-cladding layer is n-AlGaInP or n-GaInP; a second n-cladding layer of n-AlGaAs supported by the first n-cladding layer; and an inserted layer disposed between the first n-cladding layer and the second n-cladding layer, wherein the inserted layer includes the same elements as the first n-cladding layer, the inserted layer has the same composition ratios of Al and Ga (and P) as the first n-cladding layer, and the inserted layer contains a lower composition ratio of In than the first n-cladding layer.

8 Claims, 8 Drawing Sheets

SEMICONDUCTOR DEVICE AND MANUFACTURING METHOD THEREFOR

BACKGROUND OF THE INVENTION

1. Field of the Invention

The present invention relates to a semiconductor device and manufacturing method therefor, and more particularly to a semiconductor device in which a compound semiconductor containing In (indium) and a compound semiconductor not containing In form a heterointerface therebetween, and a manufacturing method therefor.

2. Description of the Related Art

In recent years, as broadband communications and public telecommunication networks using optical fibers have become widely used, there has been an increasing need to transmit a large amount of information at low cost. To meet such a demand, it is necessary to increase the amount of information that can be transmitted per unit time, that is, to increase the information transmission rate. Actually, the transmission rate has been progressively increased from 600 Mbps to 2.5 Gbps, to 10 Gbps.

Such an increase in the transmission rate of optical communications devices has led to an expansion in the market for optical communications networks for use not only in trunk systems but in access systems (offices, homes), requiring that the optical transceivers employ high-speed, high-efficiency, yet low-cost light emitting/receiving semiconductor devices.

A semiconductor laser (a semiconductor optical device), for example, is formed by growing a compound semiconductor in crystal form on an InP substrate or a GaN substrate or a GaAs substrate.

Typical compound semiconductors include Group III-V compound semiconductors in which Group III and Group V elements are combined together. Compound semiconductors having different composition may be produced by causing different numbers of Group III and Group V atoms to bond together.

These compound semiconductors include, for example, InGaAsP, GaAsP, GaPN, GaNAs, InGaN, AlGaN, AlGaInP, AlGaAs, AlGaInAs, and InGaP, which are formed on a compound semiconductor substrate such as that described above by a vapor phase epitaxy.

It should be noted that forming a laser diode (LD) or a light emitting diode (LED) requires forming a heterointerface at which different compound semiconductors meet.

Examples of heterointerfaces include, for example, AlGaN/InGaN (which refers to the interface between an InGaN layer and an AlGaN layer formed on the InGaN layer), AlGaAs/InGaP, and AlGaAs/GaAs.

In the case of such a heterointerface formed between two compound semiconductors, it would be ideal if the composition of the device were abruptly transitioned at the heterointerface from a first compound semiconductor to a second compound semiconductor. In reality, however, an altered layer is undesirably formed between the first and second compound semiconductors, and therefore there are two composition transitions at the heterointerface: from the first compound semiconductor to the altered layer and from the altered layer to the second compound semiconductor. The term "altered layer", as used herein, refers to a layer unintentionally formed when a second compound semiconductor is formed on a first compound semiconductor to form a heterojunction. The composition of this layer cannot be controlled.

In a semiconductor device including a heterojunction, generally, the thinner the altered layer, the better the characteristics of the device. It would be ideal if no altered layer was formed and hence there were only one composition transition at the heterointerface between the first and second compound semiconductors.

One example of a heterointerface used in an optical device is AlGaAs/GaAs. In this heterointerface (AlGaAs/GaAs), the first compound semiconductor is GaAs and the second compound semiconductor is AlGaAs. This means that the heterointerface portion includes only two Group III elements (namely, Al and Ga) and one Group V element (namely, As). When such a heterointerface portion is grown in crystal form, no altered layer is formed, or only a very thin altered layer is formed, since an abrupt transition can be made from the Group III element or elements of one compound semiconductor to those of the other compound semiconductor, eliminating the problem of degradation of the optical device due to formation of an altered layer.

However, such heterointerfaces as AlGaN/InGaN and AlGaAs/InGaP have the following problems.

(i) In these heterointerfaces, the lower layer contains In and Ga as Group III elements, while the upper layer contains Al and Ga as Group III elements. That is, there is a transition from a layer containing In (the lower layer) to a layer not containing In (the upper layer).

(ii) In the case of AlGaAs/InGaP, the lower layer contains P as a Group V element, while the upper layer contains As as a Group V element. That is, there is a transition from one Group V element (P) to another Group V element (As).

These problems (i) and (ii) prevent abrupt transition from the Group III and V elements of the lower layer to those of the upper layer at the heterointerface when the device is grown in crystal form. This is due to diffusion of In from a compound semiconductor containing In (the lower layer) to a compound semiconductor not containing In (the upper layer), segregation of In at the heterointerface, mutual diffusion of In and Group V atoms, and mutual diffusion of different Group V atoms promoted by In.

As a known example of a semiconductor device formed to prevent diffusion of In from the In-containing Group III-V compound semiconductor layer and a manufacturing method therefore, there is a disclosure in which an In diffusion blocking layer made up of a Te-containing Group II-IV compound semiconductor layer is formed on an In-containing Group III-V compound semiconductor layer, and a Group II-IV compound semiconductor layer is formed on the In diffusion blocking layer. (See, e.g., paragraph [0006] and FIG. 1 of Japanese Laid-Open Patent Publication No. 2000-91707.)

A semiconductor device, for example, a laser diode (LD), has a structure in which the following layers are laminated to one another over an n-type GaAs semiconductor substrate by a vapor phase epitaxy (n-type, p-type, and i-type (undoped) being hereinafter abbreviated as "n-", "p-", and "i-", respectively): an n-AlGaAs n-buffer layer; an n-AlGaInP n-first cladding layer; an n-AlGaAs n-second cladding layer; an i-AlGaAs n-side guiding layer; an active layer structure including an AlGaAs quantum well and a barrier layer; an i-AlGaAs p-side guiding layer; a p-AlGaAs p-first cladding layer; a p-GaInP p-second cladding layer; a p-AlGaInP p-third cladding layer; a p-InGaP p-BDR (Band Discontinuity Reduction) layer; and a p-GaAs contact layer.

In this laminated structure of the LD, the junction between the n-AlGaInP n-first cladding layer and the n-AlGaAs n-second cladding layer is a heterojunction, and the n-first cladding layer contains In as a Group III element whereas the n-second cladding layer does not contain In. Further, the n-first cladding layer contains P as a Group V element whereas the n-second cladding layer contains As as a Group V element instead of P.

An altered layer may be formed at such a heterointerface and may absorb light generated in the LD, resulting in reduced luminous efficiency. If the electrical resistance of the altered layer is high, an increased threshold current of the LD may result. Further, if the altered layer has high distortion, the LD may degrade.

SUMMARY OF THE INVENTION

The present invention has been devised to solve the above problems. It is, therefore, a first object of the present invention to provide a semiconductor device in which a Group III-V compound semiconductor containing In and a Group III-V compound semiconductor not containing In form a heterointerface in such a way as to minimize diffusion and segregation of In. A second object of the present invention is to provide a semiconductor manufacturing method capable of easily laminating a Group III-V compound semiconductor not containing In on a Group III-V compound semiconductor containing In while minimizing diffusion and segregation of In at the heterojunction.

According to one aspect of the invention, there is provided a semiconductor device according to the present invention comprises: a semiconductor substrate; a first compound semiconductor layer disposed on and lattice-matched to the semiconductor substrate and containing Group V elements and Group III elements including In; a second compound semiconductor layer disposed on the first compound semiconductor layer and containing Group V elements and Group III elements excluding In; and a third compound semiconductor layer disposed between the first and second compound semiconductor layers, the third compound semiconductor layer forming a heterojunction with each of the first and second compound semiconductor layers, and containing the same elements as the first compound semiconductor layer and In of the elements having a lower composition ratio than the first compound semiconductor layer.

Accordingly, in the semiconductor device according to the present invention, there is the third compound semiconductor disposed between the first and second compound semiconductors. This arrangement reduces diffusion and segregation of In, thereby preventing formation of an altered layer at the heterojunction. As a result, it is possible to prevent degradation in the optical and electrical characteristics and reliability of the semiconductor device.

According to another aspect of the invention, there is provided a method for manufacturing a semiconductor device according to the present invention comprises: forming a first compound semiconductor layer on and lattice-matched to a semiconductor substrate, the first compound semiconductor layer containing Group V elements and Group III elements including In; forming a third compound semiconductor layer on the first compound semiconductor layer so as to form a heterojunction with the first compound semiconductor layer, the third compound semiconductor layer containing the same elements as the first compound semiconductor layer and In of the elements having a lower composition ratio than the first compound semiconductor layer; and forming a second compound semiconductor layer on the third compound semiconductor layer so as to form a heterojunction with the third compound semiconductor layer, the second compound semiconductor layer containing Group V elements and Group III elements excluding In.

Accordingly, in the method for manufacturing a semiconductor device according to the present invention, it includes forming the third compound semiconductor layer, which reduces diffusion and segregation of In, thereby preventing formation of an altered layer at the heterointerface. Therefore, the method allows a simple process to manufacture a semiconductor device while preventing degradation in the optical and electrical characteristics and reliability of the device.

According to still another aspect of the invention, there is provided a semiconductor device according to the present invention comprises: a semiconductor substrate; a first compound semiconductor layer disposed on and lattice-matched to the semiconductor substrate, the first compound semiconductor layer containing a first Group V element and Group III elements including In; a second compound semiconductor layer disposed on the first compound semiconductor layer and containing a second Group V element excluding the first Group V element and Group III elements excluding In; and a third compound semiconductor layer disposed between the first and second compound semiconductor layers, the third compound semiconductor layer forming a heterojunction with each of the first and second compound semiconductor layers, containing the same composition ratios of Group III elements as the second compound semiconductor layer, and containing an equal or lower composition ratio of the first Group V element than of the second Group V element.

Accordingly, in the semiconductor device according to the present invention, there is the third compound semiconductor disposed between the first and second compound semiconductors. This arrangement reduces diffusion and segregation of In, thereby preventing formation of an altered layer at the heterojunction. As a result, it is possible to prevent degradation in the optical and electrical characteristics and reliability of the semiconductor device.

According to yet another aspect of the invention, there is provided a method for manufacturing a semiconductor device according to the present invention comprises: forming a first compound semiconductor layer on and lattice-matched to a semiconductor substrate, the first compound semiconductor layer containing a first Group V element and Group III elements including In; forming a third compound semiconductor layer on the first compound semiconductor layer so as to form a heterojunction with the first compound semiconductor layer, the third compound semiconductor layer containing the same elements as the first Group V element and the Group III elements of the first compound semiconductor layer except for In, and further containing a higher composition ratio of a second Group V element than of the first Group V element; and forming a second compound semiconductor layer on the third compound semiconductor layer so as to form a heterojunction with the third compound semiconductor layer, the second compound semiconductor layer containing the same elements as the second Group V element and the Group III elements of the third compound semiconductor layer excluding In and the first Group V element.

Accordingly, in the method for manufacturing a semiconductor device according to the present invention, it includes forming the third compound layer, which reduces diffusion and segregation of In, thereby preventing formation of an altered layer at the heterointerface. Therefore, the method allows a simple process to manufacture a semiconductor device while preventing degradation in the optical and electrical characteristics and reliability of the device.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

Although preferred embodiments according to the present invention will be described with reference to optical semiconductor devices (e.g., LDs), the invention is not limited to these semiconductor devices. The present invention may be applied to any semiconductor device in which a compound semiconductor containing In and a compound semiconductor not containing In form a heterointerface therebetween, with the same effect.

First Embodiment

Figure 1:
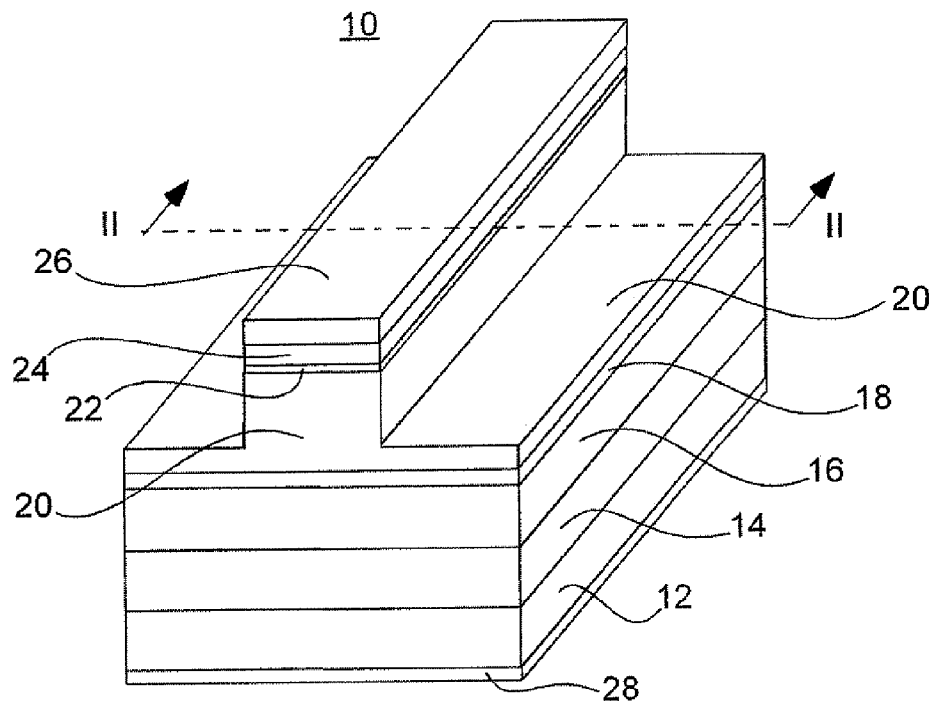
FIG. 1 is a perspective view of a semiconductor laser according to one embodiment of the present invention.
Figure 2:
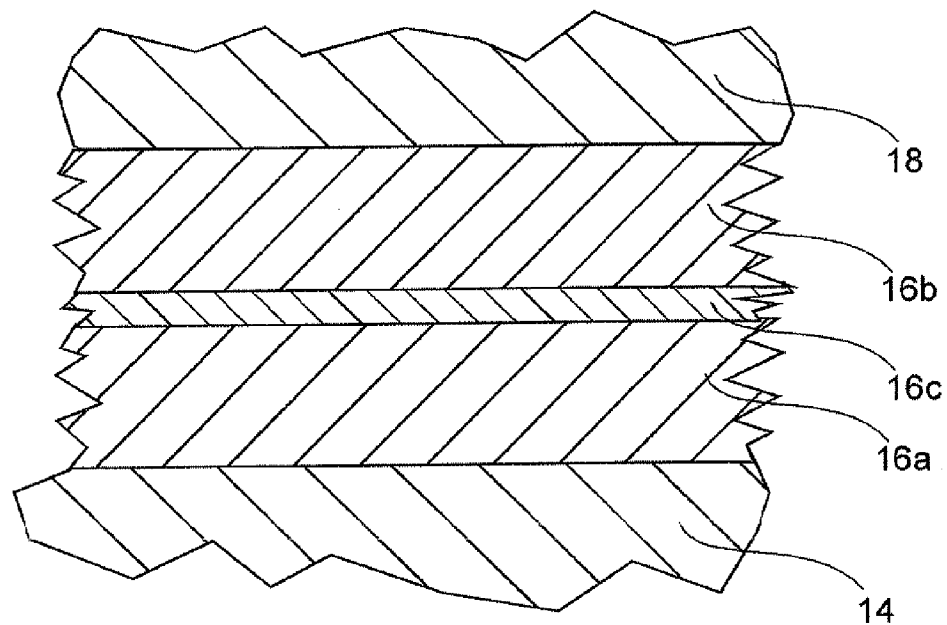
FIG. 2 is a partial cross-sectional view of a heterointerface portion of the semiconductor laser shown in FIG. 1 taken along line II-II.

FIG. 1 is a perspective view of a semiconductor laser according to one embodiment of the present invention. FIG. 2 is a partial cross-sectional view of a heterointerface portion (or heterojunction) of the semiconductor laser shown in FIG. 1 taken along line II-II. It should be noted that in these figures, like numerals are used to denote like or corresponding components.

Referring to FIG. 1, an LD 10 is a waveguide ridge type LD in which a buffer layer 14, an n-cladding layer 16, and an active region 18 are laminated to one another over an n-semiconductor substrate 12 in that order. The buffer layer 14 is formed of an n-semiconductor, and the n-cladding layer 16 is lattice-matched to the n-semiconductor substrate 12.

A p-cladding layer 20 is disposed on the active region 18. In the LD 10 of the present embodiment, a portion of the p-cladding layer 20 located at the center portion of the width of the LD 10 has a ridge shape and extends in the length direction.

A p-BDR (Band Discontinuity Reduction) layer 22 is disposed on this ridge portion of the p-cladding layer 20, and a p-contact layer 24 is disposed on the p-BDR layer 20.

The ridge portion of the p-cladding layer 20, the p-BDR layer 22, and the p-contact layer 24 form a waveguide ridge.

Further, a p-side electrode 26 is disposed on the p-contact layer 24, and an n-side electrode 28 is disposed on the underside of the n-semiconductor substrate 12.

In this LD 10, the n-semiconductor substrate 12 is formed of n-GaAs and has an impurity (Si) concentration of approximately $0.5 \times 10^{18}$ cm$^{-3}$ to $1.5 \times 10^{18}$ cm$^{-3}$ and a thickness of approximately 500 to 700 nm, for example.

The buffer layer 14 is formed of n-GaAs and has an impurity (Si) concentration of approximately $0.5 \times 10^{18}$ cm$^{-3}$-$1.5 \times 10^{18}$ cm$^{-3}$ and a thickness of approximately 100-300 nm.

In the LD 10, the n-cladding layer 16 includes the n-side heterointerface and has a structure characteristic of the present invention.

Referring to FIG. 2, the n-cladding layer 16 includes: a first n-cladding layer 16a (corresponding to a first compound semiconductor layer) tightly laminated to the buffer layer 14; an inserted layer 16c (corresponding to a third compound semiconductor layer) tightly laminated to the first n-cladding layer 16a; and a second n-cladding layer 16b (corresponding to a second compound semiconductor layer) tightly laminated to the inserted layer 16c. The first n-cladding layer 16a and the second n-cladding layer 16b are supposed to form a heterointerface therebetween.

In the LD 10, the first n-cladding layer 16a is formed of n-AlGaInP and has an impurity (Si) concentration of approximately $0.1 \times 10^{18}$ cm$^{-3}$ to $0.5 \times 10^{18}$ cm$^{-3}$ and a thickness of approximately 2000 to 4000 nm, for example. It should be noted that the first n-cladding layer 16a may be formed of GaInP (which does not contain Al) instead of AlGaInP.

The inserted layer 16c is formed of the same materials as the first n-cladding layer 16a, that is, formed of n-AlGaInP, and has an impurity (Si) concentration of approximately $0.1 \times 10^{18}$ cm$^{-3}$ to $0.5 \times 10^{18}$ cm$^{-3}$ and a thickness of approximately 5 nm to 40 nm, preferably 5 nm to 10 nm.

The n-AlGaInP inserted layer 16c contains the same compositional proportions of Al, Ga, and P as the first n-cladding layer 16a and contains a lower composition ratio of In than the first n-cladding layer 16a.

For example, assume that the composition ratio x1 of In in the first n-cladding layer 16a is 0.5. In this case, the inserted layer 16c is formed such that it contains the same compositional proportions of Al, Ga, and P as the n-cladding layer 16a and the composition ratio x2 of In in the inserted layer 16c is lower than x1 (=0.5). The ratio x2 may be set to even zero.

In this example, the inserted layer 16c is formed of n-AlGaInP since the first n-cladding layer 16a is formed of this material. If the first n-cladding layer 16a is formed of n-GaInP, the inserted layer 16c is also formed of n-GaInP. In this case, the n-GaInP inserted layer 16c is formed to contain the same compositional proportions of Ga and P as the first n-cladding layer 16a and contain a lower composition ratio of In than the first n-cladding layer 16a, as in the case where the inserted layer 16c is formed of n-AlGaInP.

The second n-cladding layer 16b is formed of n-AlGaAs and has an impurity (Si) concentration of approximately $0.05 \times 10^{18}$ cm$^{-3}$ to $0.15 \times 10^{18}$ cm$^{-3}$ and a thickness of approximately 100 to 200 nm, for example.

Thus, the heterointerface portion (or heterojunction) of the LD 10 is configured such that: the first n-cladding layer 16a is formed of n-AlGaInP or n-GaInP; the second n-cladding layer 16b is formed of n-AlGaAs; the inserted layer 16c is formed of the same material as the first n-cladding layer 16a, that is, formed of n-AlGaInP or n-GaInP; and the inserted layer 16c contains the same compositional proportions of Al and Ga (and P) as the first n-cladding layer 16a and contains a lower composition ratio of In than the first n-cladding layer 16a. When the composition ratio x1 of In in the first n-cladding layer 16a is assumed to be 0.5 (or 50%), the inserted layer 16c is formed such that it contains the same compositional proportions of Al, Ga, and P as the first n-cladding layer 16a and the composition ratio x2 of In in the inserted layer 16c is lower than x1 (=0.5).

To put it another way, the heterointerface portion of the LD 10 is configured such that: the first cladding layer 16a is formed of n-AlGaInP or n-GaInP; the second n-cladding layer 16b is formed of n-AlGaAs; the inserted layer 16c is formed of the same material as the first n-cladding layer 16a, that is, formed of n-AlGaInP or n-GaInP; the inserted layer 16c contains the same compositional proportions of Al and Ga (and P) as the first n-cladding layer 16a and contains a lower composition ratio of In than the first n-cladding layer 16a; and the inserted layer 16c has an amount of strain greater than −1.0% (e.g., −1.5%, −2%, etc.) with respect to the GaAs substrate 12 on which the crystal is grown.

The active region 18 includes: a first guiding layer tightly laminated to the second n-cladding layer 16b; a first active layer tightly laminated to the first guiding layer; a second guiding layer tightly laminated to the first active layer; a second active layer tightly laminated to the second guiding layer; and a third guiding layer tightly laminated to the second active layer.

The first to third guiding layers are formed of i-AlGaAs and has a thickness of 5 to 15 nm. Further, the first and second active layers are formed of i-AlGaAs and has a thickness of 7 to 9 nm.

The p-cladding layer 20 includes: a first p-cladding layer tightly laminated to the third guiding layer; a second p-cladding layer tightly laminated to the first p-cladding layer; and a third p-cladding layer tightly laminated to the second p-cladding layer.

The first p-cladding layer is formed of p-AlGaAs and contains impurities such as Zn, C, and Mg. For example, the impurity concentration of the first p-cladding layer is approximately between $1.0 \times 10^{18}$ cm$^{-3}$ and $2.0 \times 10^{18}$ cm$^{-3}$ and the thickness is approximately between 100 nm and 200 nm.

The second p-cladding layer is formed of p-InGaP and contains impurities such as Zn, C, and Mg. For example, the impurity concentration of the second p-cladding layer is approximately between $1.0 \times 10^{18}$ cm$^{-3}$ and $2.0 \times 10^{18}$ cm$^{-3}$ and the thickness is approximately between 20 nm and 100 nm.

The third p-cladding layer is formed of, for example, p-AlInGaP and contains impurities such as Zn, C, and Mg. The impurity concentration of the third p-cladding layer is approximately between $1.0 \times 10^{18}$ cm$^{-3}$ and $2.0 \times 10^{18}$ cm$^{-3}$ and the thickness is approximately between 1000 and 2000 nm. It should be noted that the third p-cladding layer may be formed of p-InGaP.

The p-BDR layer 22 is formed of, for example, p-InGaP and contains impurities such as Zn, C, and Mg. The impurity concentration of the p-BDR layer 22 is approximately between $0.1 \times 10^{18}$ cm$^{-3}$ and $7.0 \times 10^{18}$ cm$^{-3}$ and the thickness is approximately between 10 nm and 50 nm.

The p-contact layer 24 is formed of, for example, p-GaAs and contains impurities such as Zn, C, and Mg. The impurity concentration of the p-contact layer 24 is approximately between $20 \times 10^{18}$ cm$^{-3}$ and $40 \times 10^{18}$ cm$^{-3}$ and the thickness is approximately between 200 nm and 300 nm.

The manufacturing method will now be described.

The laminated structure of the LD 10 is formed by forming the buffer layer 14 on the n-semiconductor substrate 12 and then forming the following layers over the buffer layer 14 by a metalorganic chemical vapor deposition (MOCVD) technique or a molecular beam epitaxy (MBE) technique: the n-cladding layer 16 lattice-matched to the n-semiconductor substrate 12; the active region 18; the p-cladding layer 20; the p-BDR layer; and the p-contact layer 24 in order.

The following description will be directed to the MOCVD method. First, an n-GaAs substrate (corresponding to the n-semiconductor substrate 12) on which a crystal is to be grown is introduced into the reaction chamber of an MOCVD apparatus.

Then, thermal energy is applied to the n-GaAs substrate to increase the growth temperature (i.e., the temperature of the substrate) to 700° C. and grow a crystal.

The raw materials supplied to the reaction chamber to grow the laminated structure of the LD 10 in crystal form include trimethyl indium (TMI), trimethyl gallium (TMG), trimethyl aluminum (TMA), phosphine (PH$_3$), arsine (AsH$_3$), silane (SiH$_4$), and diethyl zinc (DEZn). These materials are thermally decomposed within the reaction chamber to grow Group III-V compound semiconductors containing Al, Ga, In, As, and P in crystal form on the GaAs substrate.

The flow rate of each material source is controlled by a mass flow controller, etc. to adjust the composition of each layer, thereby forming the n-cladding layer 16, the active region 18, the p-cladding layer 20, the p-BDR layer, and the p-contact layer 24, which are laminated to one another.

Known manufacturing processes are used to form the buffer layer 14, the active region 18, and p-cladding layer 20, the p-BDR layer, and the p-contact layer 24.

The n-cladding layer 16, on the other hand, is formed as follows.

An n-GaAs layer (corresponding to the buffer layer 14) is formed on an n-GaAs substrate (corresponding to the n-semiconductor substrate 12). This n-GaAs layer has an impurity (Si) concentration of approximately $0.5 \times 10^{18}$ cm$^{-3}$ to $1.5 \times 10^{18}$ cm$^{-3}$ and a thickness of approximately 500 nm to 700 nm. Then, an n-AlGaInP layer (corresponding to the first n-cladding layer 16a) is formed on the n-GaAs layer (or the buffer layer 14). This n-AlGaInP layer has an impurity (Si) concentration of approximately $0.1 \times 10^{18}$ cm$^{-3}$ to $0.5 \times 10^{18}$ cm$^{-3}$ and a thickness of approximately 2000 nm to 4000 nm. These layers are formed by a known manufacturing method.

After the n-AlGaInP layer (or the first n-cladding layer 16a) has been formed to a predetermined thickness, the inserted layer 16c is subsequently formed by reducing the flow rate of trimethyl indium (TMI) while maintaining the flow rates of the other gases. As a result, the formed inserted layer 16c contains the same compositional proportions of Al, Ga, and P as the n-AlGaInP layer (or the first n-cladding layer 16a) and contains a lower composition ratio of In than the n-AlGaInP layer (or the first n-cladding layer 16a). The n-AlGaInP inserted layer 16c has an impurity (Si) concentration of approximately $0.1 \times 10^{18}$ cm$^{-3}$ to $0.5 \times 10^{18}$ cm$^{-3}$ and a thickness of approximately 5 nm to 40 nm, preferably 5 nm to 10 nm.

When the composition ratio x1 of In in the first n-cladding layer 16a is assumed to be 0.5 (or 50%), the inserted layer 16c is formed such that it contains the same compositional proportions of Al, Ga, and P as the first n-cladding layer 16a and the composition ratio x2 of In in the inserted layer 16c is lower than x1 (=0.5).

To put it another way, the amount of In in the inserted layer 16c is reduced such that the inserted layer 16c has an amount of strain greater than −1.0% (e.g., −1.5%, −2%, etc.) with respect to the GaAs substrate 12 on which the crystal is grown.

After the inserted layer 16c is formed to a predetermined thickness, an n-AlGaAs layer (corresponding to the second n-cladding layer 16b) is formed on the inserted layer 16c by a known manufacturing process. This n-AlGaAs layer (or the second n-cladding layer 16b) has an impurity (Si) concentration of approximately $0.05 \times 10^{18}$ cm$^{-3}$ to $0.15 \times 10^{18}$ cm$^{-3}$ and a thickness of approximately 100 nm to 200 nm.

There will now be described the effect of the inserted layer 16c provided in the n-cladding layer of the LD according to one embodiment of the present invention with reference to graphs showing SIMS profiles of the n-cladding layer.

Figure 3:
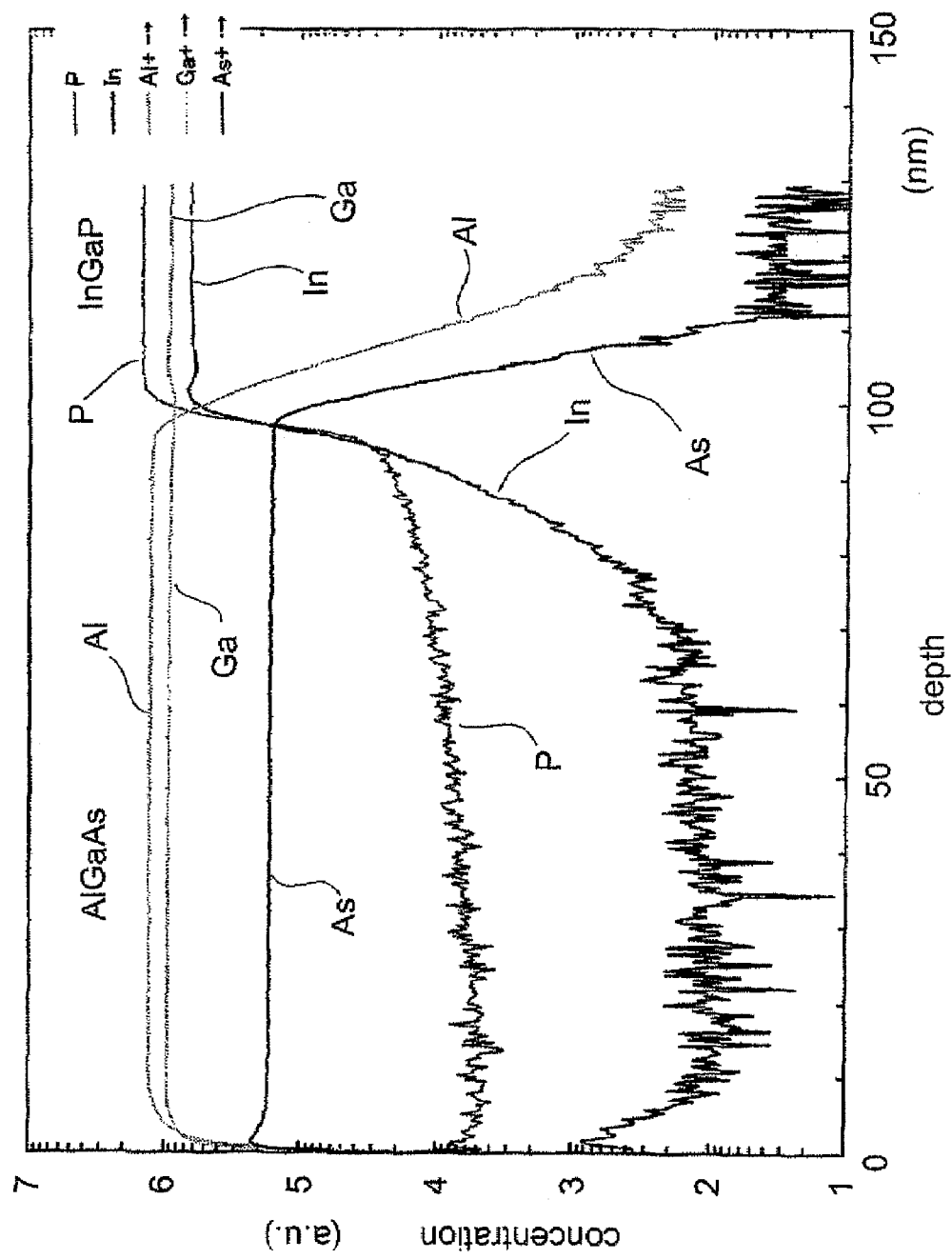
FIG. 3 is a graph showing an SIMS profile of the heterointerface portion of the LD according to one embodiment of the present invention.
Figure 4:
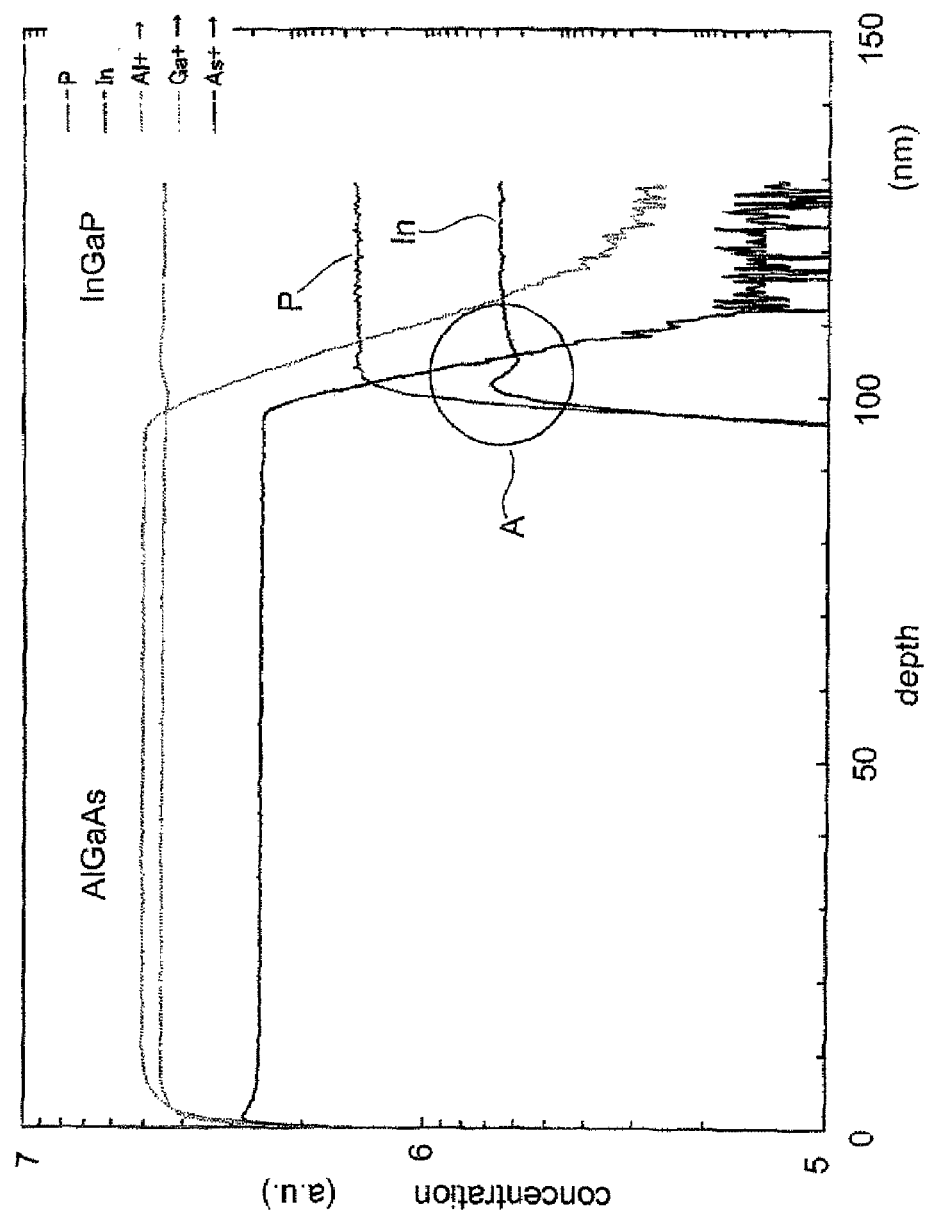
FIG. 4 is a graph showing a portion of the SIMS profile of FIG. 3.
Figure 5:
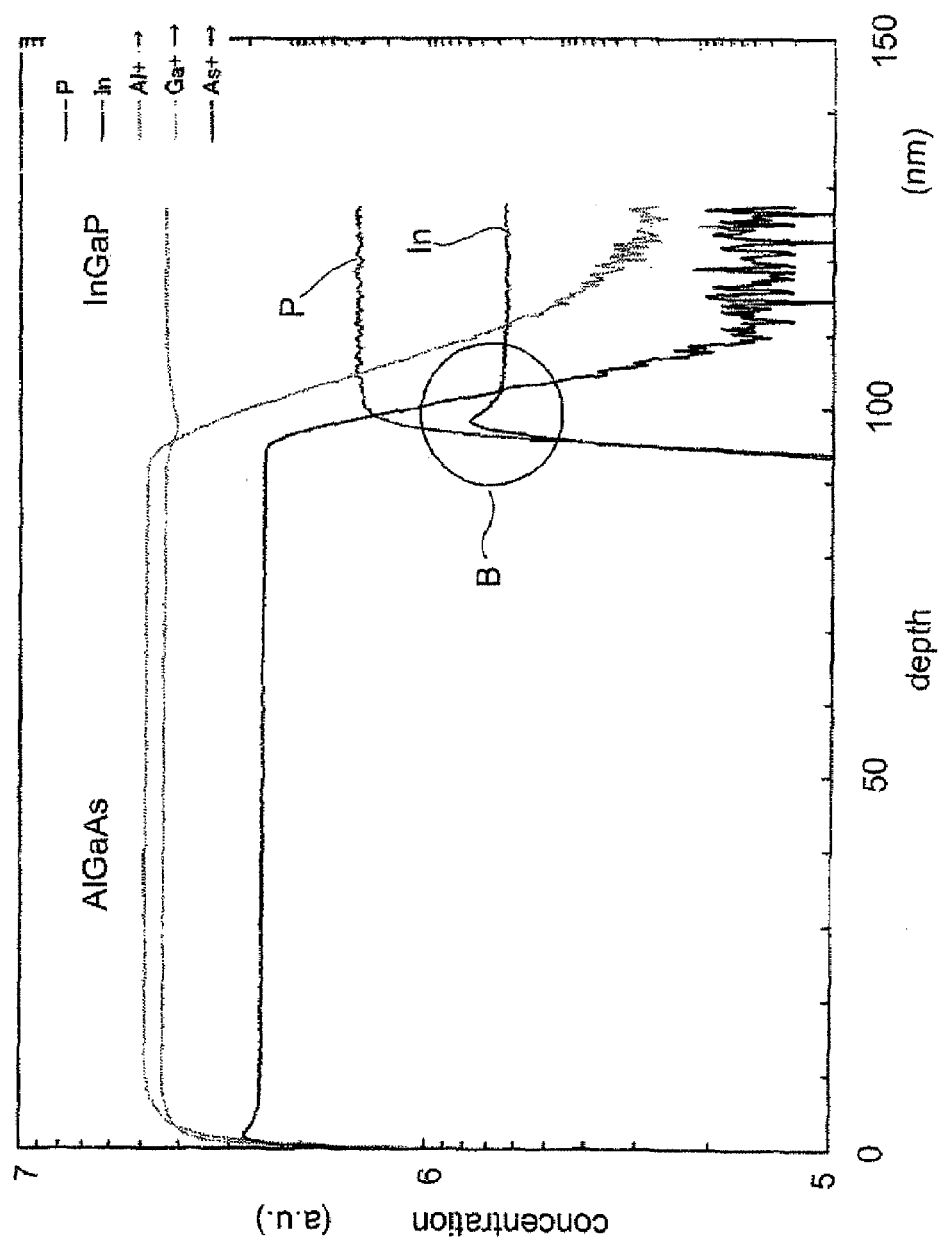
FIG. 5 is a graph showing an SIMS profile of a heterointerface portion of a conventional LD.

FIG. 3 is a graph showing an SIMS profile of the heterointerface portion (i.e., the first and second n-cladding layers and the inserted layer) of the LD according to one embodiment of the present invention. FIG. 4 is a graph showing a portion of the SIMS profile of FIG. 3, wherein the scale of the vertical axis (representing concentration) is enlarged. FIG. 5 is a graph showing an SIMS profile of a heterointerface portion of a conventional LD.

Thus, FIGS. 3 and 4 are graphs showing SIMS (Secondary Ion Mass Spectrometry) profiles of the n-cladding layer 16 of the LD 10.

FIG. 5 (provided for comparison) is a graph showing a SIMS profile of a conventional heterointerface portion that includes only the first and second n-cladding layers and does not include the inserted layer 16c.

In FIGS. 3 to 5, the vertical axis represents the concentration of each element in arbitrary units (a. u.) on a logarithmic scale. The horizontal axis represents depth from the top surface of the second n-cladding layer 16b. The inserted layer 16c is located deeper than the second n-cladding layer 16b, and the first n-cladding layer 16a is located deeper than the inserted layer 16c. That is, in FIGS. 3 to 5, the second n-cladding layer 16b, the inserted layer 16c, and the first n-cladding layer 16a are adjacent each other in that order in the direction of increasing depth value on the horizontal axis. The n-GaAs substrate (corresponding to the n-semiconductor substrate 12) is located deeper than the n-cladding layer 16 in the LD. That is, though not shown, in FIGS. 3 to 5, the substrate is located to the right of the first n-cladding layer 16a.

It should be noted that in FIGS. 3 to 5, the second n-cladding layer 16b is formed of n-AlGaAs and the first n-cladding layer 16a is formed of n-GaInP.

That is, the first n-cladding layer 16a of this example is formed of a different material than the first n-cladding layer 16a (formed of n-AlGaInP) of the LD 10 described above. However, they have substantially the same technical characteristics.

Further, since the first n-cladding layer 16a is formed of n-GaInP, the inserted layer 16c is also formed of this material. However, the inserted layer 16c has a lower composition ratio of In than the first n-cladding layer 16a.

In the SIMS profile shown in FIG. 3, the concentrations of In and P dramatically increase in a depth range around 95 nm from the top surface and then substantially stabilize at a depth slightly smaller than 110 nm. This means that the AlGaAs second n-cladding layer 6b extends from the top surface to a depth of around 95 nm, and the InGaP first n-cladding layer 16a extends from a depth of around 110 nm.

Thus, the AlGaAs second n-cladding layer 16b and the InGaP first n-cladding layer 16a are spaced apart from each other by a transition region in which the n-GaInP layer (corresponding to the inserted layer 16c) is formed.

FIG. 4 shows a portion of the SIMS profile of FIG. 3, indicating only a concentration range of 5.0 to 7.0, wherein the scale of the vertical axis (representing concentration) is enlarged.

In FIG. 4, the concentration of indium (In) first gradually decreases from the InGaP layer side toward the AlGaAs layer, then rapidly increases to a peak after drawing a gentle convex curve, as shown within circle A, and then dramatically decreases toward the top surface of the AlGaAs layer. The In concentration level at the peak is slightly higher than that in the InGaP layer.

The P concentration level at the depth at which the In concentration is peaked is substantially equal to the P concentration level in the InGaP layer. Further, as the In concentration dramatically decreases from this depth toward the top surface of the AlGaAs layer, so does the P concentration (as shown within circle A). These indicate that the interface between the AlGaAs second n-cladding layer 16b and the n-GaInP inserted layer 16c is located at a depth close to the depth at which the In concentration is peaked (as shown within circle A).

FIG. 5 shows an SIMS profile of the n-cladding layer of a conventional LD. The scale of the vertical axis in FIG. 5 is the same as that of the vertical axis in FIG. 4, allowing the SIMS profile (P, In) of FIG. 5 to be compared with that of FIG. 4.

Specifically, FIG. 5 shows an SIMS profile of an n-cladding layer in which an n-AlGaAs layer (corresponding to the second n-cladding layer) is directly formed on an n-GaInP layer (corresponding to the first n-cladding layer). That is, the n-cladding layer of this conventional LD is different from that of the LD 10 in that the n-cladding layer of the conventional LD does not include the inserted layer 16c.

In FIG. 5, the concentration of In first gradually increases from the InGaP layer toward the AlGaAs layer, then rapidly increases to a peak (as shown within circle B), and then dramatically decreases toward the top surface of the AlGaAs layer.

That is, the In concentration curve in the SIMS profile shown in FIG. 5 does not include a gentle convex portion such as that (shown within circle A) of the In concentration curve in the SIMS profile shown in FIG. 4. Furthermore, in FIG. 5 the In concentration level at the peak (shown within circle B) in the SIMS profile is significantly higher than that in the InGaP layer, whereas in FIG. 4 the In concentration level at the peak (shown within circle A) in the SIMS profile is substantially equal to that in the InGaP layer.

A comparison between the SIMS profiles shown in FIGS. 4 and 5 indicates the following.

In the example shown in FIG. 4, the n-GaInP inserted layer 16c is formed on the n-GaInP first cladding layer 16a, and the n-AlGaAs second n-cladding layer 16b is formed on the inserted layer 16c. The inserted layer 16c contains a lower composition ratio of In than the first n-cladding layer 16a. In this case, the In concentration level in the portion of the inserted layer 16c close to the interface between the second n-cladding layer 16b and the inserted layer 16c is substantially the same as that in the InGaP layer.

Further, it is considered that there remains a portion of the n-GaInP inserted layer 16c that contains a lower composition ratio of In than the first n-cladding layer 16a, since the In concentration curve of the interface portion between the second n-cladding layer 16b and the inserted layer 16c in the SIMS profile shown in FIG. 4 includes a gentle convex portion.

Therefore, even if a high In concentration layer is formed in the portion of the inserted layer 16c close to the interface between the second n-cladding layer 16b and the inserted layer 16c due to diffusion or segregation of In, the adverse effects of this altered layer may be considerably reduced, as compared to the conventional arrangement in which the n-AlGaAs second n-cladding layer is directly formed on the n-GaInP first n-cladding layer. Further, a heterointerface can be formed at which the composition of materials is abruptly transitioned from the composition of the n-GaInP first n-cladding layer 16a to that of the n-AlGaAs second n-cladding layer 16b.

Thus, according to the present embodiment, the n-GaInP inserted layer 16c is formed on the n-GaInP first n-cladding layer 16a, and the n-AlGaAs second n-cladding layer 16b is formed on the inserted layer 16c. The inserted layer 16c contains a lower composition ratio of In than the first n-cladding layer 16a. This arrangement prevents reduction of the luminous efficiency of the LD due to absorption of spontaneous emission light and stimulated emission light from the active region 18. Further, it is possible to avoid a situation where the threshold current of the LD increases due to the high electrical resistance of an altered layer or a situation where the LD degrades due to the high strain of an altered layer.

There will now be described the results of determining whether the n-cladding layer of an LD of the present embodiment includes an altered layer based on a CL (Cathode Luminescence) spectrum from the n-cladding layer.

Figure 6:
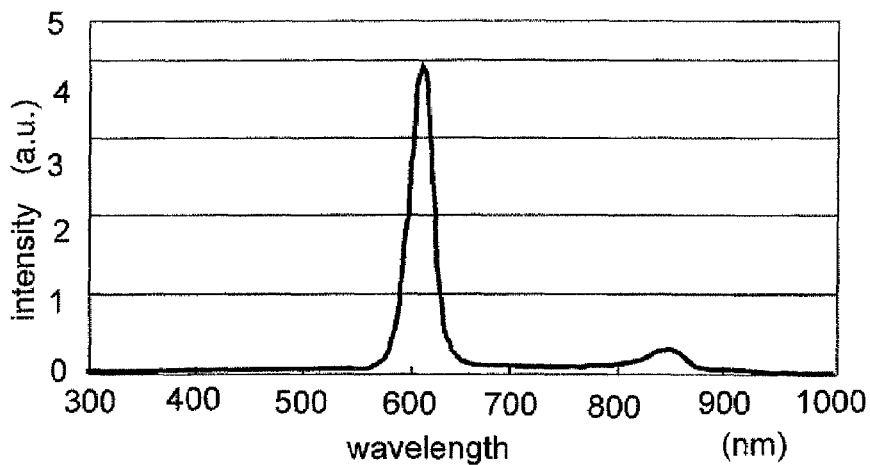
FIG. 6 is a graph showing a CL spectrum from the heterointerface portion of the LD according to one embodiment of the present invention.
Figure 7:
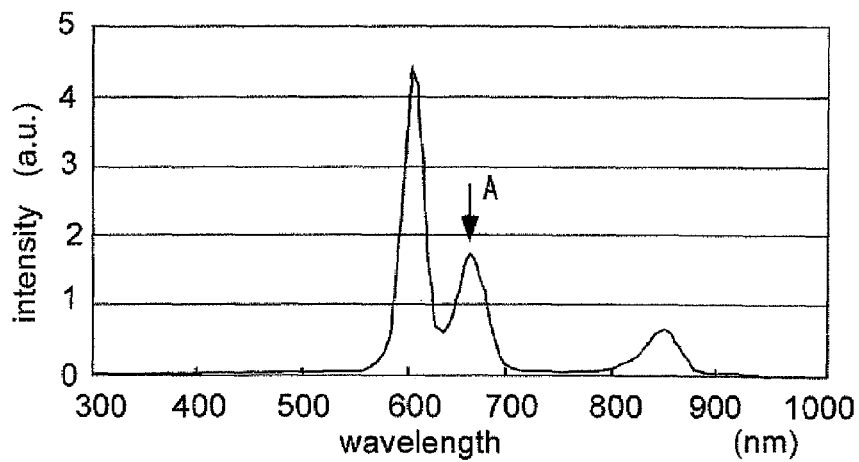
FIG. 7 is a graph showing a CL spectrum from the heterointerface portion of a conventional LD.

FIG. 6 is a graph showing a CL spectrum from the heterointerface portion (or the heterostructure) of the LD according to one embodiment of the present invention, and FIG. 7 is a graph showing a CL spectrum from the heterointerface portion of a conventional LD.

In FIGS. 6 and 7, the horizontal axis represents wavelength, and the vertical axis represents CL light intensity in arbitrary units (a. u.).

The above LD (or heterostructure) of the prevent embodiment was formed as follows. A GaAs layer (corresponding to the buffer layer 14) was formed on an n-GaAs substrate (corresponding to the n-semiconductor substrate 12), and an AlGaInP layer (corresponding to the first n-cladding layer 16a) was formed on the GaAs layer. Then, an n-GaInP inserted layer 16c containing a lower composition ratio of In than the first n-cladding layer 16a was formed on the first n-cladding layer 16a, and a second AlGaAs n-cladding layer 16b was formed on the inserted layer 16c.

The CL spectrum shown in FIG. 6 was measured after removing the AlGaAs second n-cladding layer 12 from the heterostructure by wet etching so as to expose the interface of the inserted layer 16c on that side.

The above conventional LD (or heterostructure) was formed as follows. A GaAs layer (corresponding to the buffer layer 14) was formed on an n-GaAs substrate (corresponding to the n-semiconductor substrate 12), and an AlGaInP layer (corresponding to the first n-cladding layer 16a) was formed on the GaAs layer. Then, an AlGaAs second n-cladding layer 16b was directly formed on the first n-cladding layer 16a.

As in the example shown in FIG. 6, the CL spectrum shown in FIG. 7 was measured after removing the AlGaAs second n-cladding layer 16b from the heterostructure by wet etching so as to expose the interface of the first n-cladding layer 16a on that side.

The CL spectrum shown in FIG. 6 includes only one peak, which is observed in the "optical bandgap energy band". The CL spectrum shown in FIG. 7, on the other hand, includes an additional peak (indicated by symbol A in FIG. 7) observed outside the "optical bandgap energy band".

This means that the conventional LD includes an altered layer at the heterointerface. This is because the conventional LD is constructed such that the AlGaAs second n-cladding layer 16b is directly formed on the AlGaInP layer (corresponding to the first n-cladding layer 16a). The LD of the present embodiment, on the other hand, does not include an altered layer at the heterointerface, since it is constructed such that: the n-GaInP inserted layer 16c is formed on the AlGaInP first n-cladding layer 16a; the second n-cladding layer 16b is formed on the inserted layer 16c; and the inserted layer 16c contains a lower composition ratio of In than the first n-cladding layer 16a.

In summary, the LD 10 according to the present embodiment comprises: an n-GaAs n-semiconductor substrate 12; a first n-cladding layer 16a disposed on and lattice-matched to the n-semiconductor substrate 12, the first n-cladding 16a being formed of n-AlGaInP or n-GaInP; an n-AlGaAs second n-cladding layer 16b disposed on the first n-cladding layer 16a; and an inserted layer 16c disposed between the second n-cladding layer 16b and the first n-cladding layer 16a and formed of the same material as the first n-cladding layer 16a, that is, formed of n-AlGaInP or n-GaInP. The inserted layer 16c contains the same compositional proportions of Al and Ga (and P) as the first n-cladding layer 16a and contains a lower composition ratio of In than the first n-cladding layer 16a. This arrangement prevents formation of an altered layer containing a high composition ratio of In and allows the LD to have a heterointerface at which the composition of the device is abruptly transitioned from the composition of the first n-cladding layer 16a to that of the second n-cladding layer 16b. As a result, it is possible to prevent degradation in the optical and electrical characteristics and reliability of the LD.

Further, a method for manufacturing the LD 10 according to the present embodiment includes the steps of: forming an n-GaAs buffer layer 14 on an n-GaAs substrate 12, forming a first n-cladding layer 16a of n-AlGaInP on the n-GaAs buffer layer 14 by supplying material sources such as trimethyl indium (TMI), trimethyl aluminum (TMA), trimethyl gallium (TMG), and phosphine ($PH_3$), or forming a first n-cladding layer 16a of n-GaInP on the n-GaAs n-semiconductor substrate 12 by supplying material sources such as trimethyl indium (TMI), trimethyl gallium (TMG), and phosphine ($PH_3$), the first n-cladding layer 16a being lattice-matched to the n-semiconductor substrate 12; after the above first n-cladding layer 16a forming step, subsequently forming an inserted layer 16c of n-AlGaInP (or n-GaInP) on the first n-cladding layer 16a by reducing the flow rate of trimethyl indium (TMI) while maintaining the flow rates of the other gases, the inserted layer 16c containing the same compositional proportions of Al and Ga (and P) as the first n-cladding layer 16a and containing a lower composition ratio of In than the first n-cladding layer 16a; and forming a second n-cladding layer 16b of n-AlGaAs on the inserted layer 16c. This manufacturing method prevents an increase in the In concentration of the portion of the inserted layer 16c close to the interface between the second n-cladding layer 16b and the inserted layer 16c due to diffusion and segregation of In, as well as allowing a heterointerface to be formed at which the composition of materials is abruptly transitioned from the composition of the n-AlGaInP or n-GaInP first n-cladding layer 16a to that of the n-AlGaAs second n-cladding layer 16b. As a result, it is possible to prevent degradation in the optical and electrical characteristics and reliability of the LD by employing a simple process of forming the inserted layer 16c.

Variation 1

Figure 8:
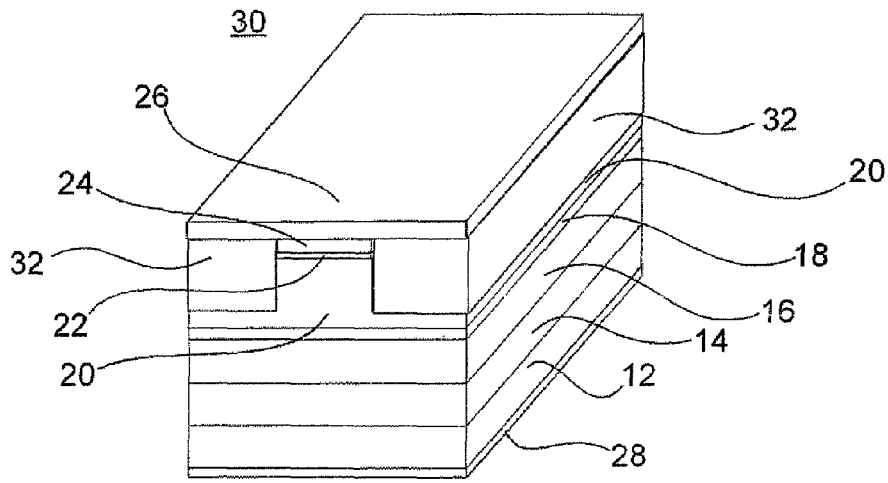
FIG. 8 is a perspective view of a variation of the semiconductor laser according to one embodiment of the present invention.

FIG. 8 is a perspective view of a variation of the semiconductor laser according to one embodiment of the present invention.

Specifically, FIG. 8 shows a buried ridge LD 30. The laminated structure of the LD 30 is basically similar to that of LD 10 except that the LD 30 includes an n-current blocking layer 32 formed on both sides of the waveguide ridge. Furthermore, the p-electrode is formed on the n-current blocking layer 32 as well as on the waveguide ridge.

Since the n-cladding layer 16 of the LD 30 has the same configuration as the n-cladding layer 16 of the LD 10 and hence includes the inserted layer 16c, the LD 30 has the same effect as the LD 10.

Variation 2

Another variation of the LD 10 is a blue LD and includes a GaN substrate as the n-semiconductor substrate 12, instead of a GaAs substrate.

A perspective view of this blue LD is similar to the perspective view of the LD 10 shown in FIG. 1. Further, a partial cross-sectional view of a heterointerface portion of the blue LD is similar to the partial cross-sectional view shown in FIG. 2.

However, in this blue LD, the n-semiconductor substrate 12 is formed of n-GaN, and the buffer layer 14 disposed on the n-semiconductor substrate 12 is formed of n-GaN.

In the blue LD, the n-cladding layer 16 includes the n-side heterointerface. Referring to FIG. 2, the n-cladding layer 16 includes: a first n-cladding layer 16a (corresponding to a first compound semiconductor layer) tightly laminated to the buffer layer 14; an inserted layer 16c (corresponding to a third compound semiconductor layer) formed of n-AlGaInN and tightly laminated to the first n-cladding layer 16a; and a second n-cladding layer 16b (corresponding to a second compound semiconductor layer) tightly laminated to the inserted layer 16c.

The first n-cladding layer 16a and the second n-cladding layer 16b are supposed to form a heterointerface therebetween, as in the LD 10.

In this example, the first cladding layer 16a is formed of n-AlGaInN. However, it may be formed of GaInN, which does not contain Al.

The inserted layer 16c is formed of the same material as the first n-cladding layer 16a (that is, n-AlGaInN).

The n-AlGaInN inserted layer 16c contains the same compositional proportions of Al, Ga, and N as the first n-cladding layer 16a and contains a lower composition ratio of In than the first n-cladding layer 16a. For example, assume that the composition ratio x1 of In in the first n-cladding layer 16a is 0.5 (or 50%). In this case, the inserted layer 16c is formed such that it contains the same compositional proportions of Al, Ga, and N as the n-cladding layer 16a and the composition ratio x2 of In in the inserted layer 16c is lower than x1 (=0.5). The composition ratio x2 may be set to even zero.

In this example, the inserted layer 16c is formed of n-AlGaInN since the first n-cladding layer 16a is formed of this material. If the first n-cladding layer 16a is formed of n-GaInN, the inserted layer 16c is also formed of n-GaInN. In this case, the n-GaInN inserted layer 16c is formed such that it contains the same compositional proportions of Ga and N as the first n-cladding layer 16a and contains a lower composition ratio of In than the first n-cladding layer 16a, as in the case where the inserted layer 16c is formed of n-AlGaInN. The second n-cladding layer 16b is formed of, for example, n-AlGaN.

Thus, the heterointerface portion (or heterojunction) is constructed such that: the first n-cladding layer 16a is formed of n-AlGaInN or n-GaInN; the second n-cladding layer 16b is formed of n-AlGaN; the inserted layer 16c is formed of the same material as the first n-cladding layer 16a, that is, n-AlGaInN or n-GaInN; the inserted layer 16c contains the same compositional proportions of Al, Ga, and N as the first n-cladding layer 16a and contains a lower composition ratio of In than the first n-cladding layer. When the composition ratio x1 of In in the first n-cladding layer 16a is assumed to 0.5 (or 50%), the inserted layer 16c is formed such that it contains the same compositional proportions of Al, Ga, and N as the first n-cladding layer 16a and the composition ratio of In in the inserted layer 16c is lower than 0.5 (or 50%).

In this case, the composition of the device is transitioned at the heterointerface from a composition containing a Group V element and In (i.e., the first n-cladding layer 16a) to that containing the same Group V element but not containing In (i.e., the second n-cladding layer 16b).

The active region 18 is formed of i-AlGaN, and the p-cladding layer 20 disposed on the active region 18 includes an AlGaN layer and an InGaN layer. The AlGaN layer is disposed on the active region 18 side and the InGaN layer is disposed on the AlGaN layer, forming a heterointerface. Further, the p-BDR layer 22 is disposed on the p-cladding layer 20, and the p-contact layer 24 is disposed on the p-BDR layer 22.

Thus, in the blue LD, an inserted layer (16c) is disposed at the heterointerface formed in the n-cladding layer 16, as in the LD 10. This arrangement prevents formation of an altered layer containing a high composition ratio of In and allows the LD to have a heterointerface at which the composition of materials is abruptly transitioned from the composition of the first n-cladding layer 16a to that of the second n-cladding layer 16b. As a result, it is possible to prevent degradation in the optical and electrical characteristics and reliability of the LD, as in the case of the LD 10.

Further, a method for manufacturing the blue LD is basically similar to that for manufacturing the LD 10 except that ammonia is used as a raw material, instead of phosphine ($PH_3$) and arsine ($AsH_3$). This method for manufacturing the blue LD includes the steps of: forming an n-GaN buffer layer 14 on an n-GaN substrate 12, forming a first n-cladding layer 16a of n-AlGaInN on the buffer layer 14 by supplying material sources such as trimethyl indium (TMI), trimethyl aluminum (TMA), trimethyl gallium (TMG), and ammonia, or forming a first n-cladding layer 16a of n-GaInN on the n-GaN n-semiconductor substrate 12 by supplying material sources such as trimethyl indium (TMI), trimethyl gallium (TMG), and ammonia, wherein the first n-cladding layer 16a is lattice-matched to the n-GaN substrate 12; after the above first n-cladding layer 16a forming step, subsequently forming an inserted layer 16c of n-AlGaInN (or n-GaInN) on the first n-cladding layer 16a by reducing the flow rate of trimethyl indium (TMI) while maintaining the flow rates of the other gases, wherein the inserted layer 16c contains the same compositional proportions of Al, Ga, and N as the first n-cladding layer 16a and contains a lower composition ratio of In than the first n-cladding layer 16a; and forming a second n-cladding layer 16b of n-AlGaN on the inserted layer 16c.

This manufacturing method prevents an increase in the In concentration of the portion of the inserted layer 16c close to the interface between the second n-cladding layer 16b and the inserted layer 16c due to diffusion and segregation of In, as well as allowing a heterointerface to be formed at which the composition of materials is abruptly transitioned from the composition of the n-AlGaInN or n-GaInN first n-cladding layer 16a to that of the n-AlGaN second n-cladding layer 16b.

As a result, it is possible to prevent degradation in the optical and electrical characteristics and reliability of the LD by employing a simple process of forming the inserted layer 16c, as in the case of the LD 10.

As described above, a semiconductor device according to the present invention comprises: a semiconductor substrate; a first compound semiconductor layer disposed on and lattice-matched to the semiconductor substrate and containing Group V elements and Group III elements including In; a second compound semiconductor layer disposed on the first compound semiconductor layer and containing Group V elements and Group III elements excluding In; and a third compound semiconductor layer disposed between the first and second compound semiconductor layers, the third compound semiconductor layer forming a heterojunction with each of the first and second compound semiconductor layers, and containing the same elements as the first compound semiconductor layer and In of the elements having a lower composition ratio than the first compound semiconductor layer.

Thus, the semiconductor device includes the third compound semiconductor layer disposed between the first and second compound semiconductor layers, This arrangement reduces diffusion and segregation of In, thereby preventing formation of an altered layer at the heterointerface. As a result, it is possible to prevent degradation in the optical and electrical characteristics and reliability of the semiconductor device.

Further, a method for manufacturing a semiconductor device according to the present invention comprises: forming a first compound semiconductor layer on and lattice-matched to a semiconductor substrate, the first compound semiconductor layer containing Group V elements and Group III elements including In; forming a third compound semiconductor layer on the first compound semiconductor layer so as to form a heterojunction with the first compound semiconductor layer, the third compound semiconductor layer containing the same elements as the first compound semiconductor layer and In of the elements having a lower composition ratio than the first compound semiconductor layer; and forming a second compound semiconductor layer on the third compound semiconductor layer so as to form a heterojunction with the third compound semiconductor layer, the second compound semiconductor layer containing Group V elements and Group III elements excluding In.

Thus, the above method includes forming the third compound semiconductor layer, which reduces diffusion and segregation of In, thereby preventing formation of an altered layer at the heterointerface. Therefore, the method allows a simple process to manufacture a semiconductor device while preventing degradation in the optical and electrical characteristics and reliability of the device.

Second Embodiment

Figure 9:
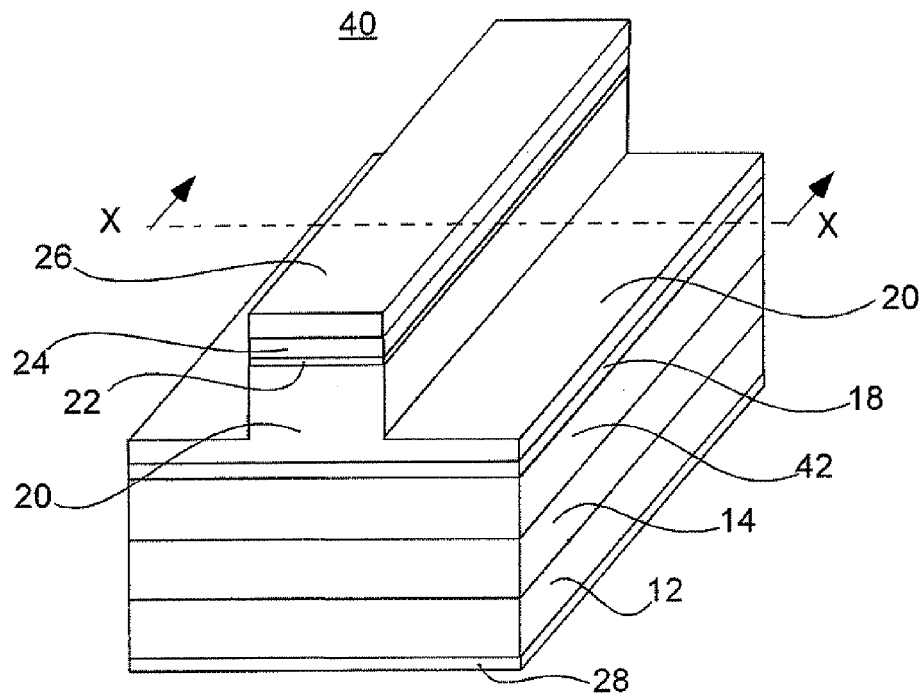
FIG. 9 is a perspective view of a semiconductor laser according to one embodiment of the present invention.
Figure 10:
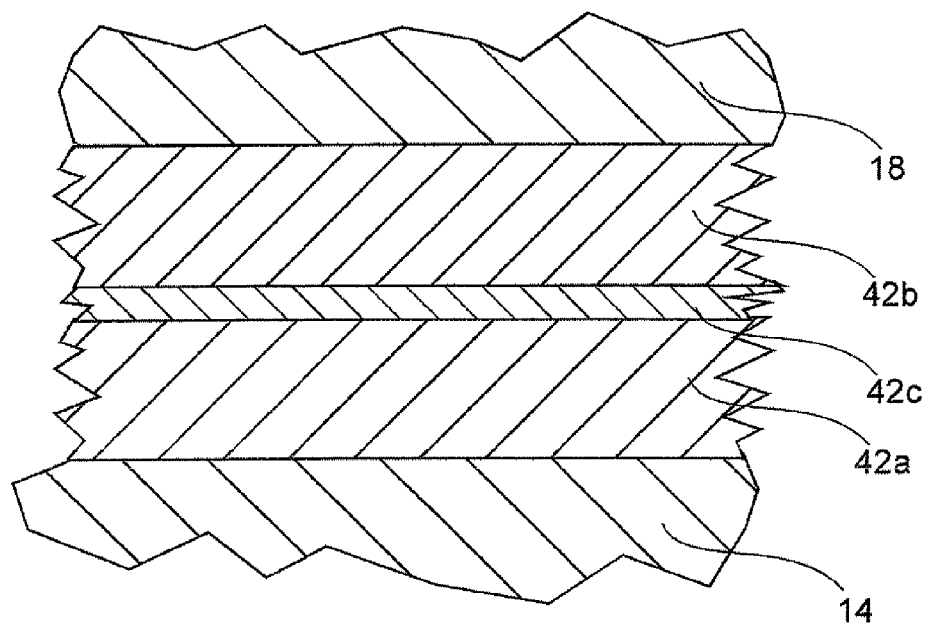
FIG. 10 is a partial cross-sectional view of a heterointerface portion of the semiconductor laser shown in FIG. 9 taken along line X-X.

FIG. 9 is a perspective view of a semiconductor laser according to one embodiment of the present invention. FIG. 10 is a partial cross-sectional view of a heterointerface portion (or heterojunction) of the semiconductor laser shown in FIG. 9 taken along line X-X.

Referring to FIG. 9, an LD 40 (the semiconductor laser of the present embodiment) basically has the same configuration as the LD 10 of the first embodiment except that the n-cladding layer 42 of the LD 40, which includes a heterointerface, has a different structure than the n-cladding layer 16 of the LD 10.

That is, in the LD 40, the n-cladding layer 42 includes the n-side heterointerface and has a structure characteristic of the present invention.

Referring to FIG. 10, the n-cladding layer 42 includes: a first n-cladding layer 42a (corresponding to a first compound semiconductor layer) tightly laminated to the buffer layer 14; an inserted layer 42c (corresponding to a third compound semiconductor layer) tightly laminated to the first n-cladding layer 42a; and a second n-cladding layer 42b (corresponding to a second compound semiconductor layer) tightly laminated to the inserted layer 42c. The first n-cladding layer 42a and the second n-cladding layer 42b are supposed to form a heterointerface therebetween.

In the LD 40, the first n-cladding layer 42a is formed of n-AlGaInP and has an impurity (Si) concentration of approximately $0.1 \times 10^{18}$ cm$^{-3}$ to $0.5 \times 10^{18}$ cm$^{-3}$ and a thickness of approximately 2000 nm to 4000 nm, for example. It should be noted that the first n-cladding layer 42a may be formed of GaInP (which does not contain Al) instead of AlGaInP.

The inserted layer 42c is formed of n-AlGaAsP, determined based on the type of material (n-AlGaInP) of the first n-cladding layer 42a, and has an impurity (Si) concentration of approximately $0.1 \times 10^{18}$ cm$^{-3}$ to $0.5 \times 10^{18}$ cm$^{-3}$ and a thickness of approximately 5 to 40 nm, preferably 5 to 10 nm.

The composition of the n-AlGaAsP inserted layer 42c is determined based on the composition of the second n-cladding layer 42b of n-AlGaAs, which is subsequently formed on the inserted layer 42c.

Specifically, the inserted layer 42c contains the same composition ratios of Al and Ga (Group III elements) as the second n-cladding layer 42b. As for As and P (Group V elements) in the inserted layer 42c, the composition ratio of As is higher than that of P. The composition ratio of P in the inserted layer 42c should not exceed 30% of that in the n-AlGaInP first n-cladding layer 42a.

With this arrangement, the inserted layer 42c has an amount of strain greater than −1.0% (e.g., −1.5%, −2%, etc.) with respect to the n-semiconductor substrate 12 on which the crystal is grown.

The second n-cladding layer 42b is formed of n-AlGaAs and has an impurity (Si) concentration of approximately $0.05 \times 10^{18}$ cm$^{-3}$ to $0.15 \times 10^{18}$ cm$^{-3}$ and a thickness of approximately 100 nm to 200 nm.

Thus, the n-side heterointerface portion (or heterojunction) of the LD 40 is constructed such that: the first n-cladding layer 42a is formed of n-AlGaInP or n-GaInP; the second n-cladding layer 42b is formed of n-AlGaAs; and the inserted layer 42c is formed of n-AlGaAsP and contains the same composition ratios of Al and Ga (Group III elements) as the second n-cladding layer 42b. As for As and P (Group V elements) in the inserted layer 42c, the composition ratio of As is higher than that of P. Further, the composition ratio of P in the inserted layer 42c should not exceed 30% of that in the n-AlGaInP first n-cladding layer 42a.

The other layers (such as the buffer 14, the active region 18, the p-cladding layer 20, the p-BDR layer 22, and the p-contact layer 24) are configured in the same way as in the LD 10.

The manufacturing method will now be described.

The following description will be primarily directed to a method for manufacturing the n-cladding layer 42, since the other layers are manufactured in the same manner as described in connection with the LD 10.

The buffer layer 14 is formed on an n-GaAs substrate, and an n-AlGaInP layer (corresponding to the first n-cladding layer 42a) is formed on the buffer layer 14. This n-AlGaInP layer has an impurity (Si) concentration of approximately $0.1 \times 10^{18}$ cm$^{-3}$ to $0.5 \times 10^{18}$ cm$^{-3}$ and a thickness of approximately 2000 to 4000 nm.

After the n-AlGaInP layer (or the first n-cladding layer 42a) has been formed to a predetermined thickness, the inserted layer 42c is formed by supplying material sources in the following manner. The flow rates of trimethyl aluminum (TMA) and trimethyl gallium (TMG), which are material sources for Al and Ga (Group III elements), are set to be the same as when the second n-cladding layer 42b is later formed.

The flow rates of the material sources for As and P (Group V elements) are set such that the composition ratio of P in the inserted layer 42c is lower than that of As and does not exceed 30% of the composition ratio of P in the n-AlGaInP first n-cladding layer 42a. This allows the inserted layer 42c to have an amount of strain greater than $-1.0\%$ (e.g., $-1.5\%$, $-2\%$, etc.) with respect to the n-semiconductor substrate 12.

The n-AlGaksP inserted layer 42c has an impurity (Si) concentration of approximately $0.1 \times 10^{18}$ cm$^{-3}$ to $0.5 \times 10^{18}$ cm$^{-3}$ and a thickness of approximately 5 nm to 40 nm, preferably 5 nm to 10 nm.

After the inserted layer 42c has been formed to a predetermined thickness, an n-AlGaAs layer (corresponding to the second n-cladding layer 42b) is formed on the inserted layer 42c by a known manufacturing process. This n-AlGaAs layer has an impurity (Si) concentration of approximately $0.05 \times 10^{18}$ cm$^{-3}$ to $0.15 \times 10^{18}$ cm$^{-3}$ and a thickness of approximately 100 nm to 200 nm. At that time, the flow rates of the material sources are set such that; the flow rates of trimethyl aluminum (TMA) and trimethyl gallium (TMG) (which are materials gases for Group III elements, namely Al and Ga) remain the same as when the inserted layer 42c was formed; the supply of phosphine (PH$_3$) is stopped; and the flow rate of arsine (AsH$_3$) is increased to a predetermined value.

There will now be described the effect of the inserted layer 42c provided in the n-cladding layer of the LD of the present embodiment with reference to graphs showing SIMS profiles of the n-cladding layer.

Figure 11:
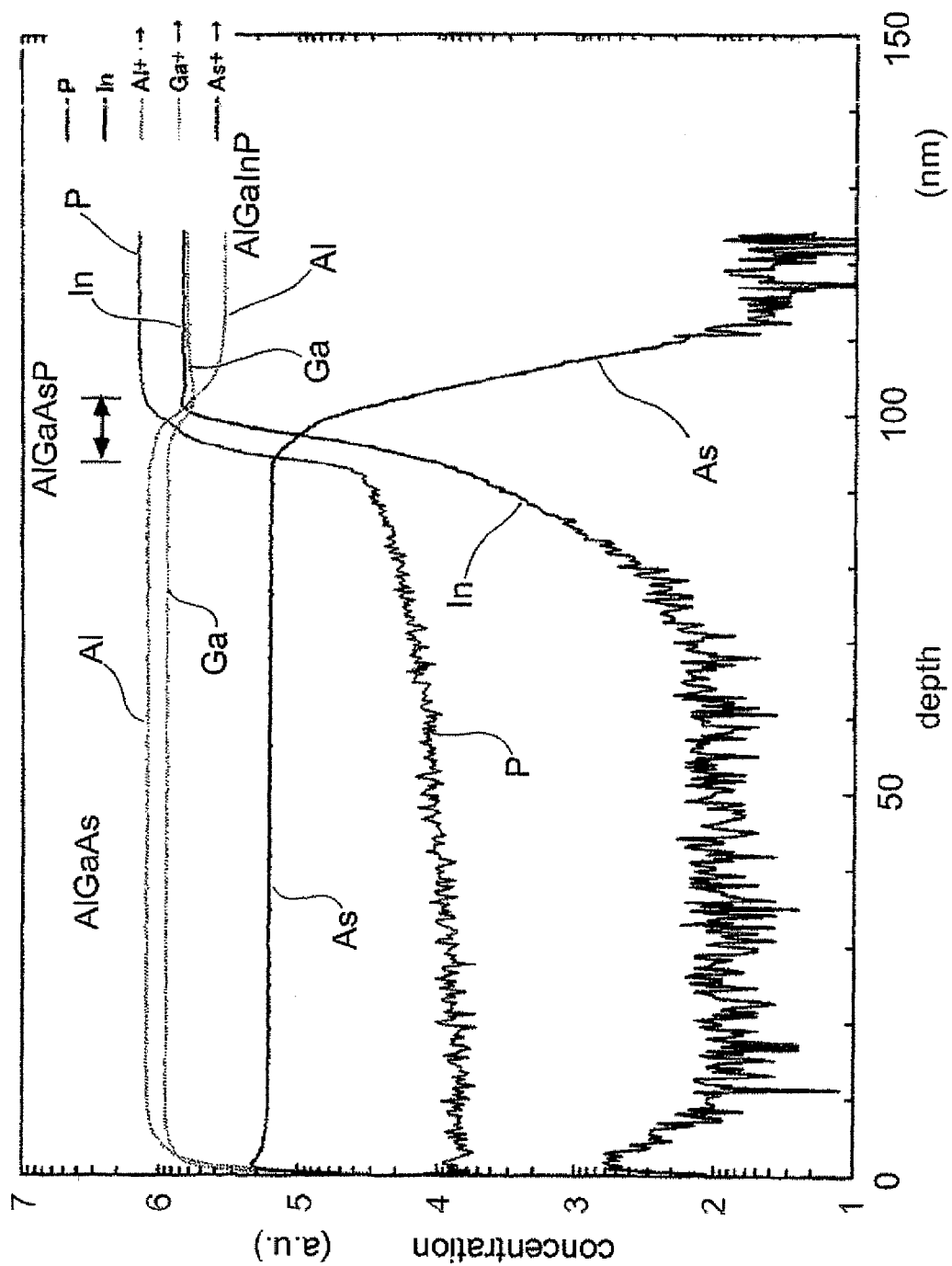
FIG. 11 is a graph showing an SIMS profile of the heterointerface portion of an LD according to one embodiment of the present invention.
Figure 12:
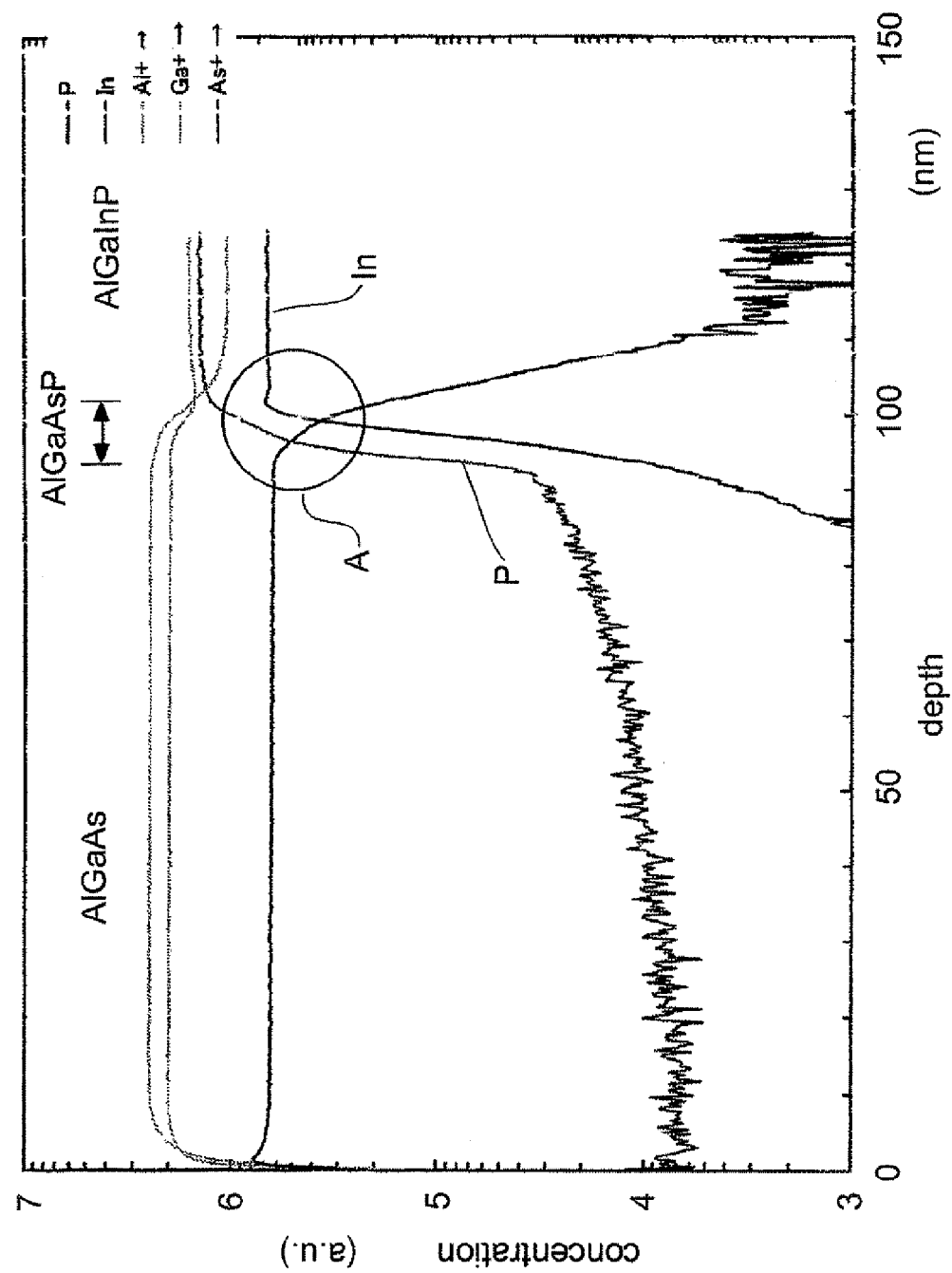
FIG. 12 is a graph showing a portion of the SIMS profile of FIG. 11.

FIG. 11 is a graph showing an SIMS profile of the heterointerface portion (i.e., the first and second n-cladding layers and the inserted layer) of an LD according to one embodiment of the present invention. FIG. 12 is a graph showing a portion of the SIMS profile of FIG. 11, wherein the scale of the vertical axis (representing concentration) is enlarged.

In FIGS. 11 and 12, the vertical axis represents the concentration of each element in arbitrary units (a. u.) on a logarithmic scale. The horizontal axis represents depth from the top surface of the second n-cladding layer 42b. The inserted layer 42c is located deeper than the second n-cladding layer 42b, and the first n-cladding layer 42a is located deeper than the inserted layer 42c. That is, in FIGS. 11 and 12, the second n-cladding layer 42b, the inserted layer 42c, and the first n-cladding layer 42a are adjacent each other in that order in the direction of increasing depth value on the horizontal axis. The n-GaAs substrate (corresponding to the n-semiconductor substrate 12) is located deeper than the first n-cladding layer 42a. That is, though not shown, in FIGS. 11 and 12, the substrate is located to the right of the first n-cladding layer 42a.

In the SIMS profile shown in FIG. 11, the concentrations of In and P dramatically increase from noise levels in a depth range around 95 nm from the top surface and then substantially stabilize at a depth slightly larger than 100 nm. This means that the AlGaAs second n-cladding layer 42b extends from the top surface to a depth of around 95 nm, and the AlGaInP first n-cladding layer 42a extends from a depth slightly larger than 100 nm (to the undersurface of the n-cladding layer 42).

Thus, the AlGaAs second n-cladding layer 42b and the InGaP first n-cladding layer 42a are spaced apart from each other by a transition region in which the n-AlGaAsP layer (corresponding to the inserted layer 42c) is formed.

FIG. 12 shows a portion of the SIMS profile of FIG. 11, indicating only a concentration range of 3.0 to 7.0, wherein the scale of the vertical axis (representing concentration) is enlarged.

In FIG. 12, the concentration of In first does not change from the AlGaInP layer side toward the AlGaAs layer, then slightly increases to a low peak in the portion of the AlGaAsP layer close to the interface between the AlGaInP layer and the AlGaAsP layer (as shown within circle A), and then dramatically decreases toward the top surface of the AlGaAs layer.

Compare this peak In concentration shown within circle A in FIG. 12 with that shown within circle B in FIG. 5 that shows a SIMS profile of an n-cladding layer of a conventional LD. The In concentration in the n-AlGaAsP inserted layer 42c is relatively low, although the n-cladding layers shown in FIGS. 12 and 5 are formed of slightly different materials and the scales of the vertical axes in FIGS. 12 and 5 are different.

Thus, the n-AlGaAsP inserted layer 42c is formed on the n-AlGaInP first n-cladding layer 42a, and the n-AlGaAs second n-cladding layer 42b is formed on the inserted layer 42c. The inserted layer 42c contains the same composition ratios of Al and Ga (Group III elements) as the second n-cladding layer 42b. As for As and P (Group V elements) in the inserted layer 42c, the composition ratio of As is higher than that of P. In this case, the In concentration level in the portion of the inserted layer 42c close to the interface between the inserted layer 42c and the first n-cladding layer 42a is slightly higher than that in the other portion, but it is not so much higher than the In concentration level in the first n-cladding layer 42a.

Therefore, even if a layer having a slightly higher In concentration is formed in the portion of the inserted layer 42c close to the interface between the first n-cladding layer 42a and the inserted layer 42c due to diffusion and segregation of In, the adverse effects of this altered layer may be considerably reduced, as compared to the conventional arrangement in which the n-AlGaAs second n-cladding layer is directly formed on the n-AlGaInP first n-cladding layer. Further, a heterointerface can be formed at which the composition of materials is abruptly transitioned from the composition of the n-AlGaInP first n-cladding layer 42a to that of the n-AlGaAs second n-cladding layer 42b.

Thus, in the LD 40, the n-AlGaAsP inserted layer 42c is formed on the n-AlGaInP first n-cladding layer 42a, and the n-AlGaAs second n-cladding layer 42b is formed on the inserted layer 42c. The inserted layer 42c contains the same composition ratios of Al and Ga (Group III elements) as the second n-cladding layer 42b. As for As and P (Group V elements) in the inserted layer 42c, the composition ratio of As is higher than that of P. This arrangement prevents reduction of the luminous efficiency of the LD due to absorption of spontaneous emission light and stimulated emission light from the active region 18, as in the case of the LD 10 of the first embodiment. Further, it is possible to avoid a situation where the threshold current of the LD increases due to the high electrical resistance of an altered layer or a situation where the LD degrades due to the high strain of an altered layer.

In summary, the LD 40 of the present embodiment comprises: an n-GaAs n-semiconductor substrate 12, a first n-cladding layer 42a disposed on and lattice-matched to the n-semiconductor substrate 12, the first n-cladding layer 42a being formed of n-AlGaInP or n-GaInP; an n-AlGaAs second n-cladding layer 42b disposed on the first n-cladding layer 42a; and an inserted layer 42c disposed between the second n-cladding layer 42b and the first n-cladding layer 42a such that the inserted layer 42c forms a heterojunction with each of the first and second n-cladding layers. The inserted layer 42c contains the same composition ratios of Al and Ga (Group III elements) as the second n-cladding layer 42b. As for As and P (Group V elements) in the inserted layer 42c, the composition ratio of As is higher than that of P. This arrangement prevents formation of an altered layer in the portion of the inserted layer 42c close to the interface between the first n-cladding layer 42a and the inserted layer 42c and hence allows the LD to have a heterointerface at which the composition of materials is abruptly transitioned from the composition of the n-AlGaInP first n-cladding layer 42a to that of the n-AlGaAs second n-cladding layer 42b. As a result, it is possible to prevent degradation in the optical and electrical characteristics and reliability of the LD.

Further, a method for manufacturing the LD 40 according to the present embodiment includes the steps of: forming a first n-cladding layer 42a of n-AlGaInP or n-GaInP on an n-GaAs n-semiconductor substrate 12 such that the first n-cladding layer 42a is lattice-matched to the n-semiconductor substrate 12; forming an inserted layer 42c on the first n-cladding layer 42a such that the inserted layer 42c contains a higher composition ratio of As (a Group V element) than of P (a Group V element) by supplying material sources such as trimethyl aluminum (TMA), trimethyl gallium (TMG), phosphine ($PH_3$), and arsine ($AsH_3$), wherein trimethyl aluminum (TMA) and trimethyl gallium (TMG) are material sources for Al and Ga (Group III elements) and the flow rates of these material sources are set to be the same as when a second n-cladding layer 42b is later formed; after the above inserted layer 42c forming step, subsequently forming the second n-cladding layer 42b of n-AlGaAs on the inserted layer 42c by supplying the above material sources, wherein the flow rates of trimethyl aluminum (TMA) and trimethyl gallium (TMG) are set to be the same as when the inserted layer 42c was formed, the supply of phosphine ($PH_3$) is stopped, and the flow rate of arsine ($AsH_3$) is increased to a predetermined value. This semiconductor manufacturing method prevents an increase in the In concentration in the heterointerface portion between the n-AlGaInP first n-cladding layer 42a and the n-AlGaAs second n-cladding layer 42b due to diffusion and segregation of In, thereby allowing the composition of the device to be abruptly transitioned at the heterointerface from the composition of the n-AlGaInP first n-cladding layer 42a to that of the n-AlGaAs second n-cladding layer 42b. As a result, it is possible to prevent degradation in the optical and electrical characteristics and reliability of the LD by employing a simple process of forming the inserted layer 42c.

As described above, a semiconductor device according to the present invention comprises: a semiconductor substrate; a first compound semiconductor layer disposed on and lattice-matched to the semiconductor substrate, the first compound semiconductor layer containing a first Group V element and Group III elements including In; a second compound semiconductor layer disposed on the first compound semiconductor layer and containing a second Group V element excluding the first Group V element and Group III elements excluding In; and a third compound semiconductor layer disposed between the first and second compound semiconductor layers, the third compound semiconductor layer forming a heterojunction with each of the first and second compound semiconductor layers, containing the same composition ratios of Group III elements as the second compound semiconductor layer, and containing an equal or lower composition ratio of the first Group V element than of the second Group V element.

Thus, the semiconductor device includes the third compound semiconductor layer disposed between the first and second compound semiconductor layers. This arrangement reduces diffusion and segregation of In, thereby preventing formation of an altered layer at the heterointerface. As a result, it is possible to prevent degradation in the optical and electrical characteristics and reliability of the semiconductor device.

Further, a method for manufacturing a semiconductor device according to the present invention comprises: forming a first compound semiconductor layer on and lattice-matched to a semiconductor substrate, the first compound semiconductor layer containing a first Group V element and Group III elements including In; forming a third compound semiconductor layer on the first compound semiconductor layer so as to form a heterojunction with the first compound semiconductor layer, the third compound semiconductor layer containing the same elements as the first Group V element and the Group III elements of the first compound semiconductor layer except for In, and further containing a higher composition ratio of a second Group V element than of the first Group V element; and forming a second compound semiconductor layer on the third compound semiconductor layer so as to form a heterojunction with the third compound semiconductor layer, the second compound semiconductor layer containing the same elements as the second Group V element and the Group III elements of the third compound semiconductor layer excluding In and the first Group V element.

Thus, the above method includes forming the third compound layer, which reduces diffusion and segregation of In, thereby preventing formation of an altered layer at the heterointerface. Therefore, the method allows a simple process to manufacture a semiconductor device while preventing degradation in the optical and electrical characteristics and reliability of the device.

It should be noted that although in the above examples the substrate is formed of GaAs or GaN, it may be formed of InP.

As described above, a semiconductor device according to the present invention is useful as semiconductor devices in which a compound semiconductor containing In and a compound semiconductor not containing In form a heterointerface in such a way as to minimize diffusion and segregation of In. A methods for manufacturing a semiconductor device according to the present invention also is useful as a method for manufacturing such semiconductor devices.

While the presently preferred embodiments of the present invention have been shown and described. It is to be understood these disclosures are for the purpose of illustration and that various changes and modifications may be made without departing from the scope of the invention as set forth in the appended claims.

What is claimed is:
1. A semiconductor device comprising:
    a semiconductor substrate;
    a first compound semiconductor layer disposed on and lattice-matched to said semiconductor substrate and containing Group V elements and Group III elements including In;
    a second compound semiconductor layer supported by said first compound semiconductor layer and containing Group V elements and Group III elements excluding In; and a third compound semiconductor layer disposed between said first and second compound semiconductor layers, said third compound semiconductor layer forming a heterojunction with each of said first and second compound semiconductor layers, and containing the same elements as said first compound semiconductor layer, wherein the In composition ratio of said third compound semiconductor layer is lower than the In composition ratio of said first compound semiconductor layer.

2. The semiconductor device according to claim 1, wherein said third compound semiconductor layer has a thickness not exceeding 40 nm.

3. The semiconductor device according to claim 1, wherein
said first compound semiconductor layer includes Ga, in addition to In, as a Group III element and includes N as a Group V element, and
said second compound semiconductor layer includes Al and Ga as Group III elements and includes N as a Group V element.

4. The semiconductor device according to claim 1, wherein
said first compound semiconductor layer includes Ga, in addition to In, as a Group III element and includes P as a Group V element, and
said second compound semiconductor layer includes Al and Ga and excludes In as Group III elements and includes As and excludes P as a Group V element.

5. A method for manufacturing a semiconductor device, comprising:
forming a first compound semiconductor layer on and lattice-matched to a semiconductor substrate, the first compound semiconductor layer containing Group V elements and Group III elements including In;
forming a second compound semiconductor layer on the first compound semiconductor layer, forming a first heterojunction with the first compound semiconductor layer, the second compound semiconductor layer containing the same elements as the first compound semiconductor layer and having a lower composition ratio of In than the first compound semiconductor layer; and
forming a third compound semiconductor layer on the second compound semiconductor layer, forming a second heterojunction with the second compound semiconductor layer, the third compound semiconductor layer containing Group V elements and Group III elements, excluding In.

6. The method for manufacturing a semiconductor device according to claim 5, wherein said second compound semiconductor layer has a thickness not exceeding 40 nm.

7. The method for manufacturing a semiconductor device according to claim 5, wherein
said first compound semiconductor layer includes Ga, in addition to In, as a Group III element and includes N as a Group V element, and
said third compound semiconductor layer includes Al and Ga as Group III elements and includes N as a Group V element.

8. The method for manufacturing a semiconductor device according to claim 5, wherein
said first compound semiconductor layer includes Ga, in addition to In, as a Group III element and includes P as a Group V element, and
said third compound semiconductor layer includes Al and Ga and excludes In as Group III elements and includes As and excludes P as a Group V element.

* * * * *